(12) United States Patent
Liu et al.

(10) Patent No.: US 11,800,661 B2
(45) Date of Patent: Oct. 24, 2023

(54) DRIVING MECHANISM AND ELECTRONIC DEVICE

(71) Applicant: BEIJING XIAOMI MOBILE SOFTWARE CO., LTD., Beijing (CN)

(72) Inventors: Zhenhua Liu, Beijing (CN); Pengfei Li, Beijing (CN)

(73) Assignee: BEIJING XIAOMI MOBILE SOFTWARE CO., LTD., Beijing (CN)

(*) Notice: Subject to any disclaimer, the term of this patent is extended or adjusted under 35 U.S.C. 154(b) by 71 days.

(21) Appl. No.: 17/518,392

(22) Filed: Nov. 3, 2021

(65) Prior Publication Data
US 2022/0418122 A1    Dec. 29, 2022

(30) Foreign Application Priority Data
Jun. 25, 2021 (CN) ............ 202110711442.7

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC ............... G06F 1/1652; H05K 5/0217
See application file for complete search history.

(56) References Cited

U.S. PATENT DOCUMENTS 10,747,269 B1 * 8/2020 Choi .................. H04M 1/0237
11,514,823 B2 * 11/2022 Shin .................. G09F 9/301
2020/0135064 A1 * 4/2020 Lee .................. G06F 1/1652
2020/0264660 A1 * 8/2020 Song .................. H04M 1/0237
2020/0267246 A1 * 8/2020 Song .................. H04M 1/0268
2021/0051272 A1 * 2/2021 Liu .................. G06F 1/1686
2022/0091636 A1 * 3/2022 Cho .................. G06F 1/1677
2022/0238047 A1 * 7/2022 Shin .................. G09F 9/301

(Continued)

FOREIGN PATENT DOCUMENTS

CN    209120296 U    7/2019
CN    112153180 A    12/2020

(Continued)

OTHER PUBLICATIONS

Translation of CN112947688 (Year: 2023).*

(Continued)

*Primary Examiner* — Sagar Shrestha
(74) *Attorney, Agent, or Firm* — COZEN O'CONNOR

(57) ABSTRACT

A driving mechanism, includes a frame body, as well as a driving assembly and a transmission assembly mounted on the frame body; the driving assembly including a driving member and a reduction gearbox structure connected together and mounted to the frame body; the transmission assembly including a first transmission member and a second transmission member, the first transmission member being mounted to the frame body and connected to the reduction gearbox structure, the second transmission member being in transmission connection with a flexible display screen. The driving member outputs a first torque to be converted into a second torque, and the second torque is output to the first transmission member, to drive the flexible display screen to move, wherein the first torque is less than the second torque.

19 Claims, 10 Drawing Sheets

(56) References Cited

U.S. PATENT DOCUMENTS

2022/0253103 A1\* 8/2022 Choi .................. G06F 1/203
2022/0311849 A1\* 9/2022 Jia ..................... H04M 1/0237

FOREIGN PATENT DOCUMENTS

| | | | | |
|---|---|---|---|---|
| CN | 112947688 | \* | 6/2021 | ........... G06F 1/1624 |
| JP | 2018066454 | A | 4/2018 | |
| JP | 2021513669 | A | 5/2021 | |
| KR | 20160141255 | A | 12/2016 | |
| KR | 20180027318 | A | 3/2018 | |
| KR | 20200093821 | A | 8/2020 | |
| WO | WO 2021107619 | A1 | 6/2021 | |

OTHER PUBLICATIONS

Japanese Patent Application No. 2021-177453, Office Action dated Nov. 29, 2022, 3 pages.
Japanese Patent Application No. 2021-177453, English translation of Office Action dated Nov. 29, 2022, 3 pages.
Korean Patent Application No. 10-2021-0146599, Office Action dated Nov. 15, 2022. 6 pages.
Korean Patent Application No. 10-2021-0146599, English translation of Office Action dated Nov. 15, 2022. 7 pages.
European Patent Application No. 21207136.9 extended Search and Opinion dated May 12, 2022, 13 pages.

\* cited by examiner

DRIVING MECHANISM AND ELECTRONIC DEVICE

CROSS-REFERENCE TO RELATED APPLICATION

The present disclosure is based on and claims priority to Chinese Patent Application No. 202110711442.7, filed on Jun. 25, 2021, the entire content of which is incorporated herein by reference.

BACKGROUND

With the continuous advancement of screen technology, large-scale production of foldable flexible screens, and advent of 0.01 mm flexible display screens all over the world, form of terminal products becomes increasingly diverse. From smart wears to smart homes and to smart phone terminals, ultra-thin flexible screens lead to multi-directional designs of future products, such as foldable mobile phones, ring mobile phones, heterogeneously curved terminal products, and the like. The arrival of 5G enables all smart products to be electrically connected and the acceleration of the data transmission enables some modules of smart terminal products, such as camera modules, BOX acoustic modules, and the like, to be separated from smart terminal products and to achieve their functions. With a further development of battery technology, size of the terminal product is smaller, battery capacity is higher, and design form of the terminal product is more flexible.

With increasing requirements for flexible screen products, when dealing with different tasks such as watching videos and making phone calls, the display area needs to be enlarged or reduced to improve user experience. Currently, there are mainly two screen expansion structures: foldable screen structure and retractable screen structure.

SUMMARY

The present disclosure relates to a technical field of retractable screen products, and more particularly, to a driving mechanism and an electronic device.

The present disclosure provides a driving mechanism and an electronic device to solve at least part of the problems in a related art.

According to a first aspect, embodiments of the present disclosure provide a driving mechanism for a retractable screen structure. The driving mechanism includes a frame body, as well as a driving assembly and a transmission assembly mounted on the frame body.

In one embodiment, the driving assembly includes a driving member and a reduction gearbox structure connected to the driving member, both the driving member and the reduction gearbox structure being mounted to the frame body;

In another embodiment, the transmission assembly includes a first transmission member and a second transmission member movably connected to the first transmission member, the first transmission member being mounted to the frame body and connected to the reduction gearbox structure, the second transmission member being configured to be in transmission connection with a flexible display screen of the retractable screen structure;

In another embodiment, the driving member outputs a first torque to the reduction gearbox structure, the reduction gearbox structure converting the first torque into a second torque and outputting the second torque to the first transmission member to drive the first transmission member to rotate, the second transmission member moving relative to the first transmission member to drive the flexible display screen to move, wherein the first torque is less than the second torque.

According to a second aspect, embodiments of the present disclosure provide an electronic device, including:

a housing including a first housing and a second housing slidably arranged on the first housing along a first direction, the first housing and the second housing being enclosed to form a receiving structure with an opening;

a retractable screen structure arranged in the receiving structure, the retractable screen structure including a bracket and a flexible display screen, a first end of the flexible display screen being connected to the bracket and located on a side close to bottom of the housing, a second end of the flexible display screen being connected to the first housing to cover the opening; and the driving mechanism including a frame body, as well as a driving assembly and a transmission assembly mounted on the frame body;

the driving assembly including a driving member and a reduction gearbox structure connected to the driving member, both the driving member and the reduction gearbox structure being mounted to the frame body;

the transmission assembly including a first transmission member and a second transmission member movably connected to the first transmission member, the first transmission member being mounted to the frame body and connected to the reduction gearbox structure, the second transmission member being configured to be in transmission connection with a flexible display screen of the retractable screen structure;

the driving member outputting a first torque to the reduction gearbox structure, the reduction gearbox structure converting the first torque into a second torque and outputting the second torque to the first transmission member to drive the first transmission member to rotate, the second transmission member moving relative to the first transmission member to drive the flexible display screen to move, wherein the first torque is less than the second torque;

the driving mechanism being arranged in the receiving structure, the driving mechanism being connected to the bracket and configured to drive the bracket to move along the first direction;

the driving mechanism driving the bracket to move along the first direction, so as to drive the second housing and the first end of the flexible display screen to move along the first direction relative to the first housing, such that the flexible display screen is switched between a retracted state and an expanded state.

It is to be understood that both the foregoing general description and the following detailed description are exemplary and explanatory only and are not restrictive of the present disclosure, as claimed.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Figure 1:
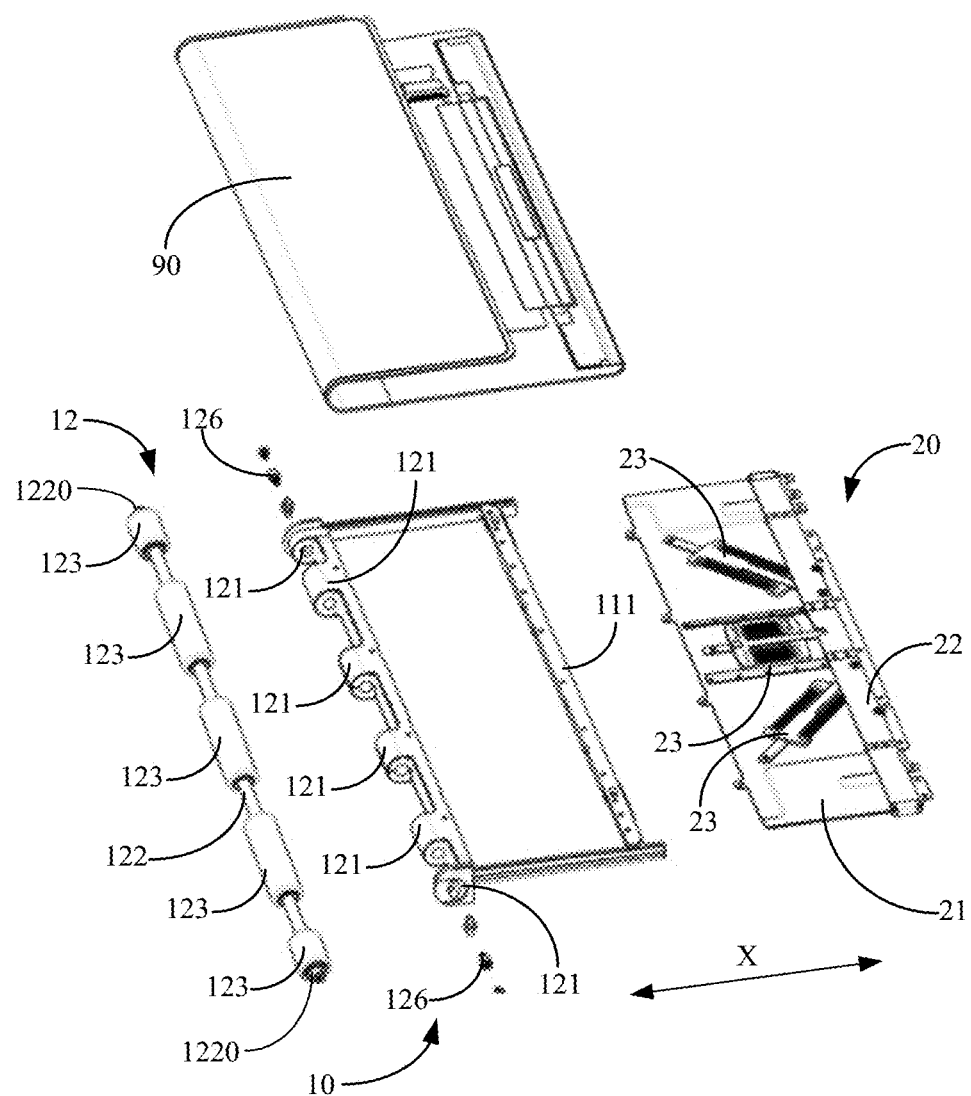
FIG. 1 is an exploded view of a retractable screen structure according to an embodiment of the present disclosure.

Embodiments of the present disclosure will be described in details herein, and the examples thereof are illustrated in the accompanying drawings. When the description below concerns the drawings, same numbers in different drawings represent same or similar elements unless indicated otherwise. In the following embodiments, the embodiments illustrated do not represent all embodiments consistent with the present disclosure. Instead, they are merely examples of devices and methods consistent with some aspects of the present disclosure as detailed in the appended claims.

The terms used in the present disclosure are merely for the purpose of describing specific embodiments, which are not intended to limit the present disclosure. Unless defined otherwise, the technical or scientific terminologies used in the present disclosure shall be the general meaning understood by those skilled in the related art of the present disclosure. Terms such as "first", "second" and the like used in the descriptions and claims of the present disclosure do not indicate any order, quantity or importance, but are only used to distinguish different components. Similarly, terms such as "one" or "a" do not refer to quantity limitation, but to indicate the existence of at least one. Similarly, terms such as "one" or "a" do not refer to quantity limitation, but to indicate the existence of at least one. "a plurality" or "several" means two and more than two. Unless specified otherwise, terms such as "front portion", "rear portion", "lower portion" and/or "upper portion", and the like are merely for convenience of description, and are not limited to one position or one spatial orientation. Terms such as "comprise" or "comprising" and the like mean that the elements or objects presented before "comprise" or "comprising" contain the elements or objects presented after "comprise" or "comprising" and their equivalents, which do not exclude other elements or objects. The terms "mounted," "connected," and the like are not restricted to physical or mechanical connections, can also be electrical connections, no matter direct or indirect.

The terms used in the present disclosure are merely for the purpose of describing specific embodiments, which are not intended to limit the present disclosure. As used in the descriptions and the appended claims of the present disclosure, "a" and "the" in singular forms mean including plural forms, unless clearly indicated in the context otherwise. It should also be understood that, as used herein, the term "and/or" represents and contains any and all possible combinations of one or more associated listed items.

The present disclosure provides a driving mechanism and an electronic device. a sliding rail mechanism, a retractable structure and the electronic device of the present disclosure will be described in detail below with reference to the accompanying drawings. In the case of no conflict, the features in the following embodiments and implementations may be combined with each other.

Figure 2:
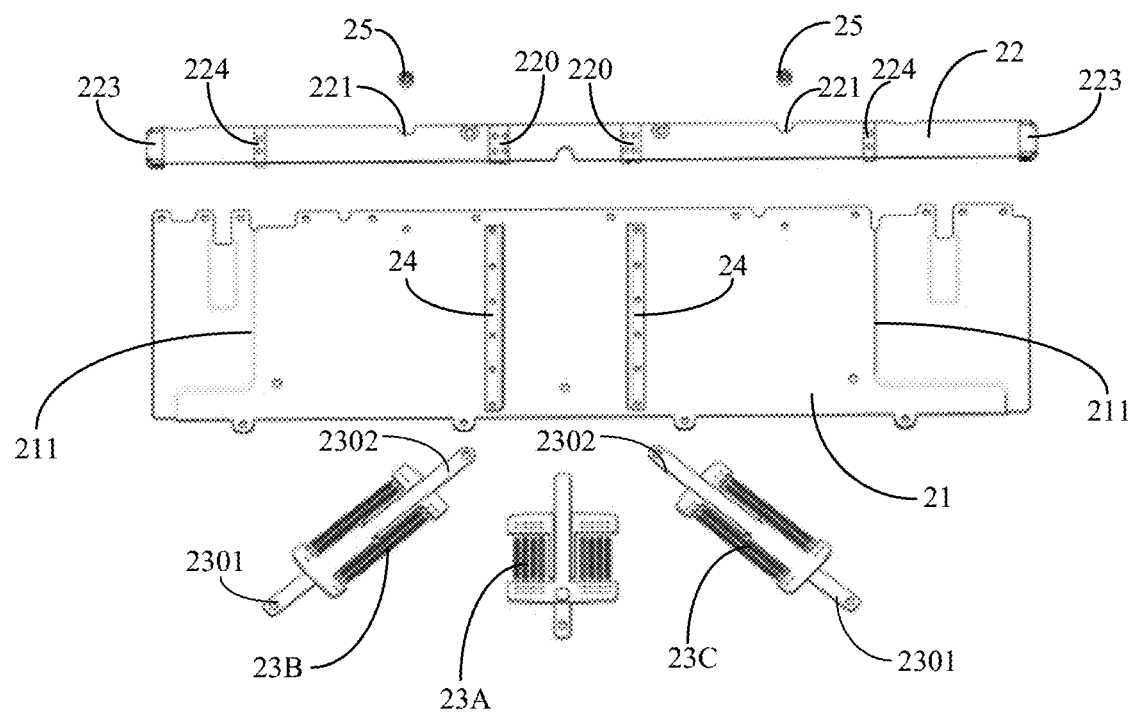
FIG. 2 is an exploded schematic view of a sliding rail assembly of a sliding rail mechanism according to an embodiment of the present disclosure.
Figure 3:
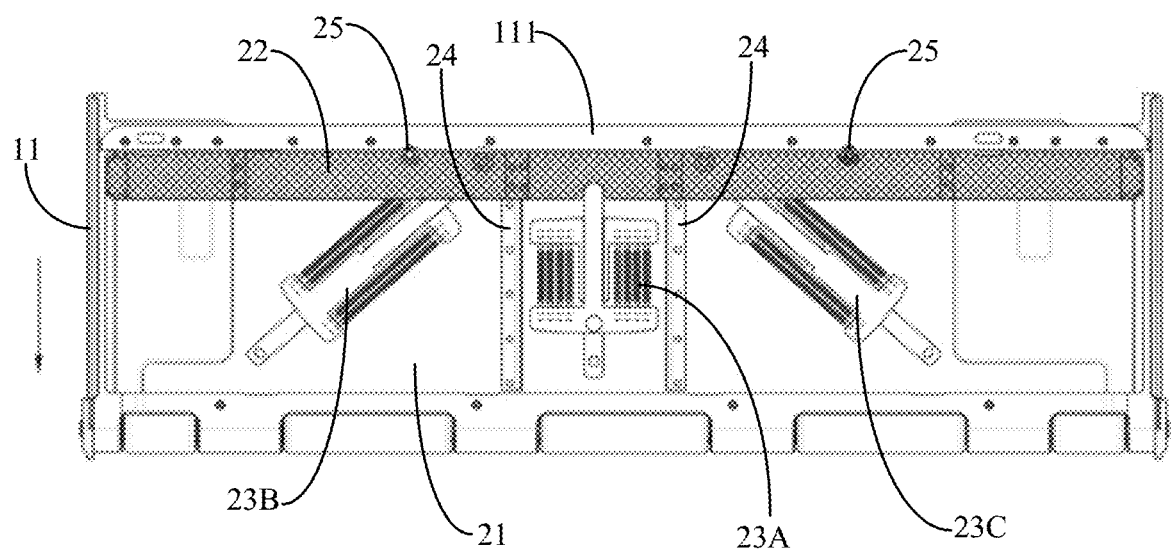
FIG. 3 is a structural view of a sliding rail mechanism according to an embodiment of the present disclosure.

Referring to FIGS. 1 to 3, an embodiment of the present disclosure provides an electronic device, including: a bracket assembly 10, a rotating shaft assembly 12, a flexible display screen 90, and a sliding rail assembly 20. The bracket assembly 10 includes a bracket 11. The sliding rail assembly 20 includes a fixed base 21, a sliding member 22 configured to connect the flexible display screen 90 of a retractable screen structure, and an elastic assembly 23. The fixed base 21 is fixedly connected to the bracket 11, the sliding member 22 is slidingly arranged on the fixed base 21 along a first direction X (a vertical direction illustrated in FIG. 3), a first end 2301 of the elastic assembly 23 is connected to the fixed base 21, and a second end 2302 of the elastic assembly 23 is connected to the sliding member 22. When sliding relative to the fixed base 21 along the first direction X, the sliding member 22 drives the second end of the elastic assembly 23 and the flexible display screen 90 to move together. The elastic assembly 23 is stretched or compressed under the drive of the sliding member 22 to deform, thereby generating a pre-tension to the flexible display screen 90. It can be understood that the sliding member 22 slides relative to the fixed base 21 along a direction indicated by an arrow in FIG. 3, and then stretches the elastic assembly 23 to generate a reverse tension force.

In the sliding rail mechanism with the above arrangement, the sliding member 22 moves along the first direction X relative to the fixed base 21, and then enables to drive the flexible display screen 90 of the retractable screen structure to move together, thereby realizing the expanding and retracting of the flexible display screen 90. The sliding member 22 drives the elastic member 23 to move together so as to stretch the elastic member 23, thereby generating a pre-tension on the flexible display screen 90. Thus, the flexible display screen 90 becomes much flatter when expanded, thereby preventing visual problems such as bulging, swelling and distortion of the screen when the whole device is slid open.

In some other implementations, the sliding rail assembly 20 further includes at least one guide rail 24 arranged on the fixed base 21 and extending along the first direction X, the sliding member 22 is defined with a sliding groove 220 corresponding to the guide rail 24, and the sliding member 22 is slidably arranged on the guide rail 24 through the sliding groove 220. In the present embodiment, four sets of guide rails 24 are provided and symmetrically arranged on the fixed base 21, such that the sliding member 22 may slide more stably. In other examples, there may also be other numbers of guide rails 24, which is not limited in the present disclosure.

In some other implementations, the sliding rail assembly 20 further includes at least one limit stopper 25, arranged at an end of the fixed base 21 away from the bracket 11 (i.e., an upper end in FIG. 3). The sliding member 22 is provided with a limit portion 221 abutting against and cooperating with the limit stopper 25. The limit stopper 25 abuts against and cooperates with the limit portion 221 of the sliding member 22 to limit a starting position of the sliding member 22 and also prevent the sliding member 22 from separating from the guide rail 24. In the present embodiment, the limit portion 221 may be understood as a groove, two limit stoppers 25 are provided and symmetrically arranged on the fixed base 21, two limit portions 221 are provided and correspond to the limit stoppers 25, which is not limited in the present disclosure. In the example illustrated in FIG. 3, the limit stoppers 25 are arranged at an upper end of the fixed base 21, and a starting position of the sliding member 22 is located at the upper end of the fixed base 21. In this state, the elastic assembly 23 applies an elastic pre-tension to the sliding member 22 so as to keep the sliding member 22 at the starting position.

Figure 4:
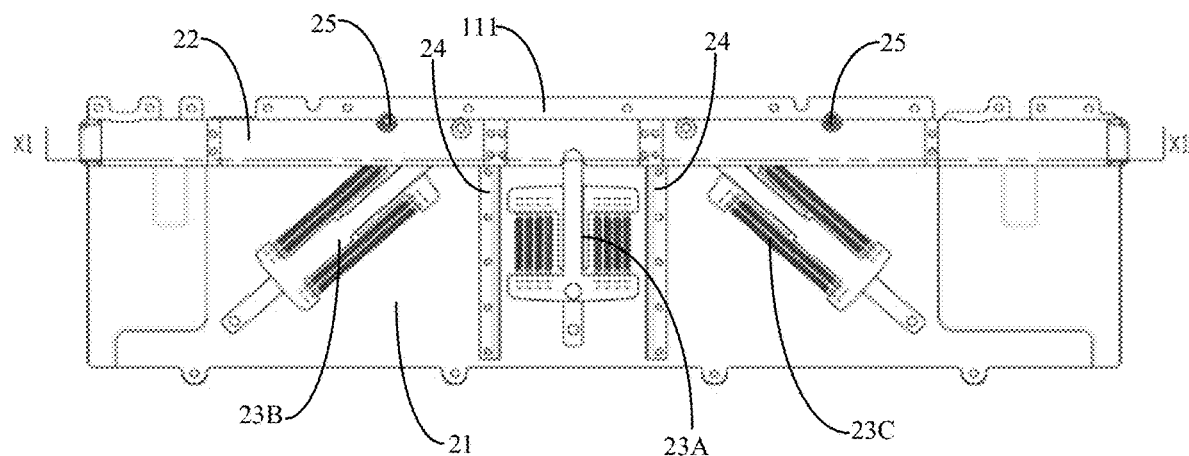
FIG. 4 is a structural view of a sliding rail assembly of a sliding rail mechanism according to an embodiment of the present disclosure.
Figure 5:
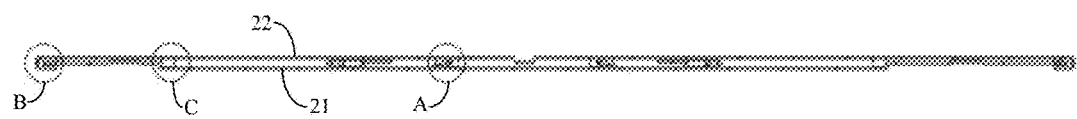
FIG. 5 is a sectional view illustrated in FIG. 4 along X1-X1 direction.
Figure 6:
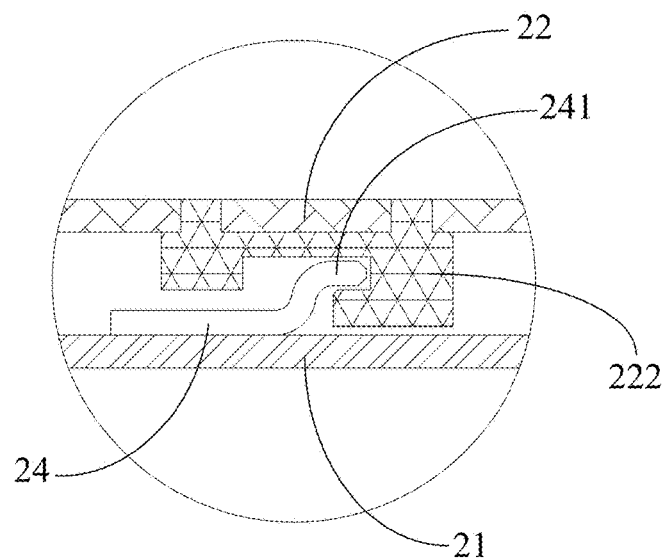
FIG. 6 is a partially enlarged view of a position A in FIG. 5.

Referring to FIGS. 4 to 6, in some other implementations, at least one side of the guide rail 24 is provided with a clamping portion 241, and the sliding member 22 is provided with a first snap portion 222 snapped with the clamping portion 241. The sliding member 22 is snapped with the clamping portion 241 of the guide rail 24 through the first snap portion 222 so as to be more securely connected to the guide rail 24, such that the sliding member 22 may more stably slide along the guide rail 24. It may be understood that the clamping portion 241 may be an inverted hook structure machined from a sheet metal part to prevent the sliding member 22 from moving away from the guide rail 24. In the present embodiment, two sides of the guide rail 24 are each provided with the clamping portion 241, which is not limited in the present disclosure.

Figure 7:
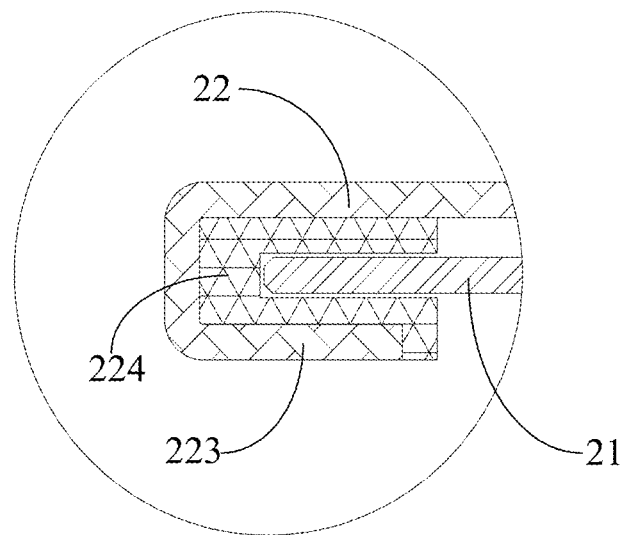
FIG. 7 is a partially enlarged view of a position B in FIG. 5.

Referring to FIG. 7, in some other implementations, the side of the sliding member 22 is provided with a second snap portion 223 snapped with a side of the fixed base 21. The sliding member 22 is snapped with the side of the fixed base 21 through the second snap portion 223, such that the sliding member 22 and the fixed base 21 are connected more stably and the sliding member 22 is prevented from separating from the fixed base 21 when sliding, thus improving the sliding stability of the sliding member 22. Further, the sliding rail assembly 20 further includes a plastic snap 224, covering and snapped at the side of the fixed base 21, and the second snap portion 223 is snapped to the plastic snap 224. The plastic snap 224 enables to reduce friction between the second snap portion 223 and the side of the fixed base 21, reduce wear and ensure smooth sliding. In the present embodiment, the plastic snap 224 may be made of POM (Polyoxymethylene) plastic which is a self-lubricating plastic. The sliding member 22 and the plastic snap 224 may be combined as one part through an insert-molding process. A design gap between the plastic snap 224 and the side of the fixed base 21 is 0.05 mm to ensure that the sliding member 22 may only slide along an extending direction of the guide rail 24, i.e., the first direction X, thus improving the structural stability.

Figure 8:
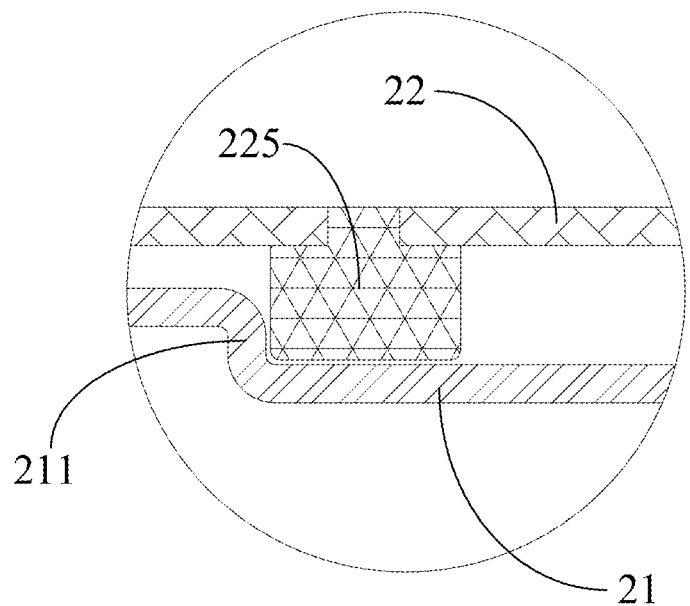
FIG. 8 is a partially enlarged view of a position C in FIG. 5.

Referring to FIG. 8, in some other implementations, the fixed base 21 is provided with a step portion 211 extending along the first direction X, and the sliding member 22 is provided with an abutting block 225 abutting against the step portion 211. Through cooperation between the abutting block 225 and the step portion 211, the sliding member 22 may be further prevented from separating from the fixed base 21 when sliding.

Figure 9:
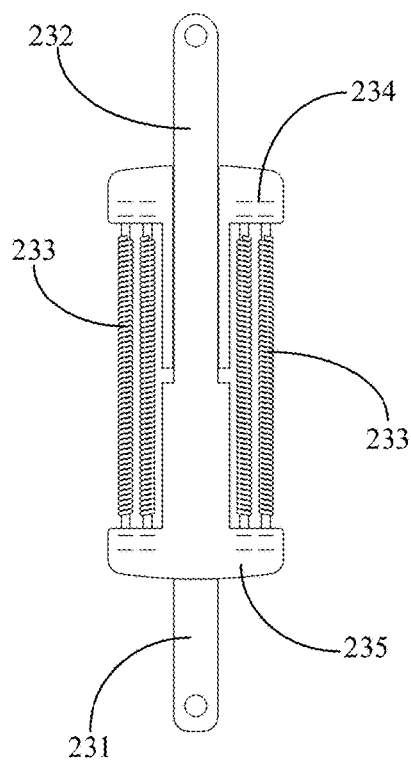
FIG. 9 is a structural view of an elastic assembly of a sliding rail mechanism according to an embodiment of the present disclosure.

Referring to FIG. 9, in some other implementations, the elastic assembly 23 includes a first rod 231, a second rod 232, and elastic members 233. The first rod 231 and the second rod 232 are inserted into each other and slidable relative to each other, and the elastic member 233 is connected between the first rod 231 and the second rod 232. The first rod 231 is connected to the fixed base 21, and the second rod 232 is connected to the sliding member 22. The elastic member 233 may be a spring, a tension spring, or the like, and has a pre-tension during assembly to keep the sliding member 22 at the starting position. When the first rod 231 and the second rod 232 are stretched, the spring starts to work. When sliding relative to the fixed base 21, the sliding member 22 drives the second rod 232 to slide relative to the first rod 231 and cooperates with the first rod 231 to stretch or compress the elastic member 233, such that the elastic member 233 is deformed to generate an elastic force to the sliding member 22.

Further, the first rod 231 and the second rod 232 are each defined with a sliding groove, and the first rod 231 and the second rod 232 are inserted into each other and slidable relative to each other. A first end (a lower end illustrated in FIG. 9) of the first rod 231 is fixed to the fixed base 21 by a rivet, and a first end (an upper end illustrated in FIG. 9) of the second rod 232 is fixed to the sliding member 22 by a rivet, a second end of the first rod 231 protrudes outward to form a first protrusion 234, and a second end of the second rod 232 protrudes outward to form a second protrusion 235; there are a plurality sets of the elastic members 233 evenly arranged between the first protrusion 234 and the second protrusion 235, which may provide sufficient elastic force. When sliding relative to the fixed base 21, the sliding member 22 drives the second rod 232 to slide relative to the first rod 231 and cooperates with the first rod 231 to stretch the elastic member 233, such that the elastic member 233 is deformed to generate a reverse tension on the sliding member 22, thus ensuring that the flexible display screen is in a "tightened" state.

In some other implementations, there are a plurality of the elastic assemblies 23, including a first elastic assembly 23A, a second elastic assembly 23B, and a third elastic assembly 23C. The second elastic assembly 23B and the third elastic assembly 23C are symmetrically arranged on two sides of the first elastic assembly 23A. The elastic member 233 of the first elastic assembly 23A extends along the first direction X, and the elastic members 233 of the second elastic assembly 23B and the third elastic assembly 23C are symmetrically arranged along the first direction X and inclined with respect to the first direction X.

Due to limited space, it is difficult for a single guide rail to achieve such a large elastic stroke. Based on the above arrangement, the three sets of elastic assemblies may form a relay form to improve the sliding stroke of the elastic assemblies. The second elastic assembly 23B and the third elastic assembly 23C are in the same design and are arranged symmetrically on two sides of the elastic assembly 23A. An initial compression amount of the elastic member of the first elastic assembly 23A may be slightly greater than the initial compression amounts of the elastic members of the second elastic assembly 23B and the third elastic assembly 23C, thereby achieving a greater sliding stroke. Assuming that the designed total sliding stroke is 30.00 mm, the first elastic assembly 23A may start working after the sliding member 22 slides by 19 mm.

In some other embodiments, the sliding rail assembly 20 may be fixed to the bracket 11 as a whole by riveting. An end of the bracket 11 may include a connecting plate 111, and the fixed base 21 may be a stamped metal plate and fixed to the connecting plate 111 through a riveting process. The flexible display screen 90 is fixed to the sliding member 22 of the sliding rail assembly 20. The bracket 11 may be made of an aluminum alloy to improve the structural strength. The sliding member 22 may be machined from a SUS stainless steel plate and a POM plastic by the insert-molding process. The stainless steel plate may serve as a body to play the role of strength support. The sliding groove may be made of the POM plastic by insert-molding and may slide relative to the fixed base 21 and the guide rail 24 to reduce friction. The limit stopper 25 may be made of a plastic material and may limit the starting position of the sliding member 22 and also prevent the sliding member 22 from separating from the guide rail 24. The guide rail 24 may be machined from stainless steel by a stamping process and fixed to the fixed base 21 by spot welding. The guide rail 24 cooperates with the sliding groove 220 in the sliding member 22 to form an inverted hook structure to prevent the sliding member 22 from moving away from the guide rail 24 when sliding. An exposed surface of the sliding member 22 may serve as an adhesive area 226 to be adhered and fixed to the flexible display screen 90.

Figure 10:
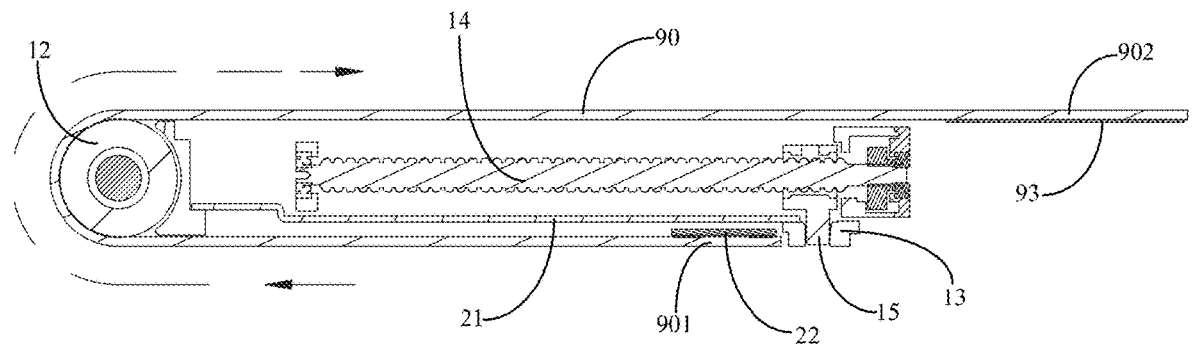
FIG. 10 is a structural view of a retractable screen structure according to an embodiment of the present disclosure.

Referring to FIGS. 1 and 10, an embodiment of the present disclosure provides a retractable screen structure, including the sliding rail mechanism and the flexible display screen 90 described in the above embodiments. The rotating shaft assembly 12 is arranged on a side of the bracket 11 away from the sliding rail assembly 20, and an axial direction of the rotating shaft assembly 12 is perpendicular to the first direction X. A first end of the flexible display screen 90 is connected to the sliding member 22, and a second end of the flexible display screen 90 is wound on the rotating shaft assembly 12.

The rotating shaft assembly 12 includes a rotating shaft support, a rotating shaft 122, and a rotating wheel. The rotating shaft support is connected to a side of the bracket 11 away from the sliding rail assembly 20 and is defined with a shaft hole, and a circumferential direction of the shaft hole is perpendicular to the first direction X. The rotating shaft 122 passes through the shaft hole, and the rotating wheel is fitted over the rotating shaft 122. The flexible display screen 90 is wound on the rotating wheel, and when the flexible display screen 90 is expanded or retracted, the rotating wheel is driven to rotate. It may be understood that the first end 901 of the flexible display screen 90 is connected to the sliding member 22 of the sliding rail assembly 20, and the second end 902 of the flexible display screen 90 is wound on the rotating wheel. In the present embodiment, the flexible display screen 90 is formed by bonding a flexible OLED screen and a layer of extremely thin stainless steel mesh together and has great flexibility.

Based on the above arrangement, the flexible display screen 90 is wound on the rotating wheel of the rotating shaft assembly 12. When the flexible display screen 90 is expanded or retracted, the rotating wheel is driven to rotate, that is, the rotating wheel rotates passively. The rotating wheel may function as a pulley such that the flexible display screen 90 may be expanded and retracted more smoothly, which effectively reduces the friction and energy loss during the expanding and retracting process of the flexible display screen 90, thereby enabling the flexible display 90 to be expanded or retracted more smoothly.

In some other implementations, the rotating shaft 122 is fixedly connected to the shaft hole, and the rotating wheel is rotatably connected to the rotating shaft 122. It may be understood that the rotating shaft 122 is fixedly connected to the rotating shaft support, the rotating wheel is rotatable relative to the rotating shaft 122, and the rotating shaft does not rotate relative to the rotating shaft support. When the flexible display screen 90 is expanded or retracted, only the rotating wheel is driven to rotate.

Figure 11:
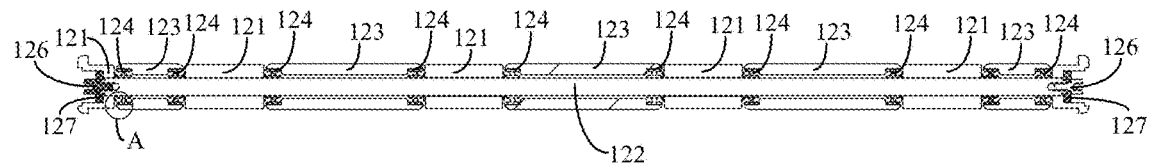
FIG. 11 is a structural view of a rotating shaft assembly of a retractable screen structure according to an embodiment of the present disclosure.

Referring to FIGS. 1 and 11, in some other implementations, the rotating shaft support includes a plurality of sub-supports 121, which are arranged on the bracket 11 along a direction perpendicular to the first direction X and spaced apart from each other. Each sub-support 121 is defined with a sub-shaft hole; the sub-shaft holes of the plurality of sub-supports 121 are coaxially arranged to define the shaft hole, and the rotating shaft 122 passes through the plurality of sub-shaft holes so as to be fixedly connected with the plurality of sub-supports 121. The rotating shaft includes a plurality of sub-rotating wheels 123, and one of the plurality of sub-rotating wheels 123 is arranged between two adjacent sub-supports 121. It may be understood that the rotating shaft support is configured as the plurality of sub-supports 121, the rotating wheel is configured as the plurality of sub-rotating wheels 123, and the sub-supports 121 and the sub-rotating wheels 123 are arranged alternately, which may ensure the rotation performance of the rotating wheel, enhance the strength of the rotating shaft support, and improve the overall structural strength. It may be understood that each of the sub-supports 121 of the rotating shaft support is fixedly connected to the bracket 11, or may also be integrally formed with the bracket 11. It should be noted that all the sub-supports 121 may be different in size, for example, may be divided into small supports and large supports, and the sub-supports located on both sides is small supports, and the sub-support located at middle position is a large support. All the sub-rotating wheels 123 may also be different in size, for example, may be divided into large rotating wheels and small rotating wheels, which may be arranged according to actual needs and will not be limited in the present disclosure.

In some other implementations, the rotating shaft assembly 12 further includes a plurality of first bearings 124 fitted over the rotating shaft 122, and each of two sides of the sub-rotating wheel 123 is provided with one first bearing 124. The first bearing 124 includes an inner bearing ring and an outer bearing ring rotatably connected to the inner bearing ring, the inner bearing ring is connected to the rotating shaft 122, and the outer bearing ring is connected to the sub-rotating wheel 123. It may be understood that the sub-rotating wheel 123 rotates relative to the rotating shaft 122 through the first bearing 124, and the first bearing 124 may reduce the friction loss caused by the rotation of the sub-rotating wheel 123. The inner bearing ring and the rotating shaft 122 may have a zero-match design in a radial direction to ensure that the inner bearing ring cannot rotate together with the sub-rotating wheel 123. The sub-rotating wheel 123 and the rotating shaft 122 may have an avoidance design in the radial direction to ensure that a gap is defined between the sub-rotating wheel 123 and the rotating shaft 122 to achieve rotation.

Figure 12:
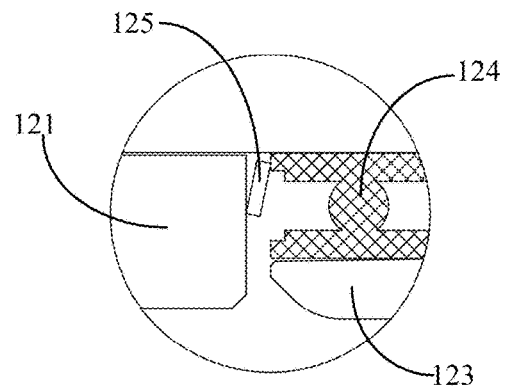
FIG. 12 is an enlarged view of position A in FIG. 11.

Referring to FIG. 12, in order to prevent the inner bearing ring from rotating together with the sub-rotating wheel 123, that is, to ensure that the inner bearing ring does not rotate relative to the rotating shaft 122, the rotating shaft assembly 12 further includes a plurality of bearing spacers 125 fitted over the rotating shaft 122, and a side of each first bearing 124 is provided with a bearing spacer 125. One end of the bearing spacer 125 abuts against the inner bearing ring, and the other end of the bearing spacer 125 abuts against the adjacent sub-support 121. In this way, the inner bearing ring and the adjacent sub-support 121 may be pressed against each other to prevent the inner bearing ring from rotating together with the sub-rotating wheel 123, thus ensuring that the inner bearing ring does not rotate relative to the rotating shaft 122. In this way, the rotation of the sub-rotating wheel 123 completely relies on the rotation of the outer bearing ring and the friction loss is relatively low.

In some other implementations, in some other implementations, the bearing spacer 125 is made of copper or stainless steel, with a bowl-like cross section, and has a mechanical property that is slightly compressible in a thickness direction. A bottom end of the bowl-like structure abuts against the inner bearing ring, and a bowl opening end of the bowl-like structure abuts against the adjacent sub-support 121, such that the inner bearing ring and the adjacent sub-support 121 are pressed against each other.

In some other implementations, the rotating shaft assembly 12 further includes two sets of first fasteners 126. One end of the rotating shaft 122 is fixedly connected to the rotating shaft support through one set of the first fasteners 126, and the other end of the rotating shaft 122 is fixedly connected to the rotating shaft support through the other set of the first fasteners 126. It may be understood that the first fasteners 126 pass through the outermost sub-support 121 and are fixedly connected to the ends of the rotating shaft 122, so as to fix the rotating shaft 122 and the rotating shaft support together. In some other implementations, a gasket 127 is further provided between the first fastener 126 and the rotating shaft support. The first fastener 126 may be a dual screw, and the gasket 127 is provided between the first fastener 126 and the outermost sub-support 121 such that the rotating shaft 122 and the rotating shaft support may be connected more firmly. Further, a gap between the sub-support 121 and the inner bearing ring may be set to zero match or slight interference (depending on the material and the sizes of the parts). Thus, a pressure exists between the bearing spacer 125 and the inner bearing ring through the locking force of the dual screws arranged at the two ends, and this pressure may ensure that the inner bearing ring does not rotate relative to the rotating shaft 122.

In the present embodiment, the sub-rotating wheel 123 may be made of the engineering plastic POM by insert-molding and is defined with a through hole in the middle and grooves at two ends to place the first bearings 124, the sub-rotating wheel 123 is fitted over the rotating shaft 122, and may be rotated passively on the rotating shaft 122 by the first bearings 124 after assembly. The rotating shaft 122 may be a D-shaped shaft with a D-shaped cross section, and is mainly configured to fix the inner bearing ring, thereby preventing the inner bearing ring from rotating relative to the rotating shaft. The rotating shaft 122 may be made of stainless steel, and the rotating shaft 122 passes through the plurality of sub-supports 121. Threads 1220 may be formed at two ends of the rotating shaft 122 to achieve fastening connection with the first fasteners 126 and to be easily fixed to a middle frame of the electronic device, thereby fixing the rotating shaft. The first fastener 126 may be made of metal material, such as a dual screw. The first fastener 126 passes through the gasket 127 and is locked on the rotating shaft 122 to lock the rotating shaft 122 and the rotating shaft support. The material of the first bearing 124 may be stainless steel or ceramic, and the first bearing 124 is mounted on the sub-rotating wheel 123. Two ends of each sub-rotating wheel 123 are each mounted with one first bearing 124 and also mounted with the bearing spacer 125. The bearing spacer 125 may be made of a metal. During mounting of the sub-rotating wheels on the rotating shaft, each of two sides of each rotating wheel is placed with one bearing spacer, and the rotating shaft passes through the inner holes of the bearing spacers. After the two ends of the rotating shaft are locked by the dual screws, the gasket functions to fix the inner bearing ring to prevent the inner bearing ring from rotating with the outer bearing ring, and the gasket further functions to ground the first bearing and the bracket.

Figure 13:
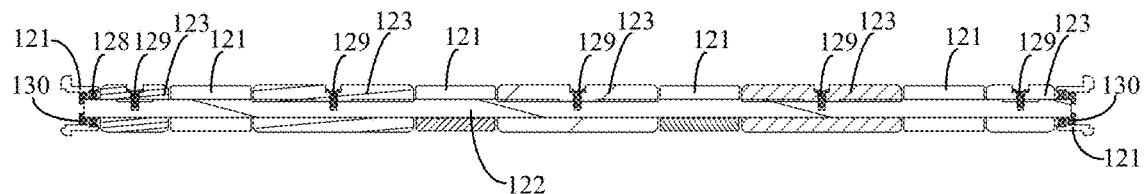
FIG. 13 is a structural view of a rotating shaft assembly of a retractable screen structure according to another embodiment of the present disclosure.

Referring to FIGS. 1 and 13, in some other implementations, the rotating shaft 122 is rotatably connected with the shaft hole, and the rotating wheel is fixedly connected with the rotating shaft 122. It may be understood that the rotating shaft 122 is fixedly connected to the rotating wheel, the rotating wheel does not rotate relative to the rotating shaft 122, and the rotating shaft 122 is rotatable relative to the rotating shaft support. When the flexible display screen 90 is expanded or retracted, the flexible display screen 90 drives the rotating wheel and the rotating shaft 122 to rotate together.

In some other implementations, the rotating shaft support includes a plurality of sub-supports 121, which are arranged on the bracket 11 along a direction perpendicular to the first direction X and spaced apart from each other. Each sub-support 121 is defined with a sub-shaft hole; the sub-shaft holes of the plurality of sub-supports 121 are coaxially arranged to define the shaft hole, and the rotating shaft 122 passes through the plurality of sub-shaft holes so as to be fixedly connected with the plurality of sub-supports 121. The rotating shaft includes a plurality of sub-rotating wheels 123, and one of the plurality of sub-rotating wheels 123 is arranged between two adjacent sub-supports 121. It may be understood that the rotating shaft support is configured as the plurality of sub-supports 121, the rotating wheel is configured as the plurality of sub-rotating wheels 123, and the sub-supports 121 and the sub-rotating wheels 123 are arranged alternately, which may ensure the rotation performance of the rotating wheel, enhance the strength of the rotating shaft support, and improve the overall structural strength. It may be understood that each of the sub-supports 121 of the rotating shaft support is fixedly connected to the bracket 11, or may also be integrally formed with the bracket 11. It should be noted that all the sub-supports 121 may be different in size, for example, may be divided into small supports and large supports, and the sub-supports located on both sides is small supports, and the sub-support located at middle position is a large support. All the sub-rotating wheels 123 may also be different in size, for example, may be divided into large rotating wheels and small rotating wheels, which may be arranged according to actual needs and will not be limited in the present disclosure.

In some other implementations, the rotating shaft assembly 12 further includes two second bearings 128 which are respectively fitted over two ends of the rotating shaft 122, and the ends of the rotating shaft 122 are rotatably connected with the rotating shaft support through the second bearings 128. The second bearing 128 includes an inner bearing ring and an outer bearing ring rotatably connected to the inner bearing ring, the inner bearing ring is connected to the rotating shaft support, and the outer bearing ring is connected to the rotating shaft 122. It may be understood that the rotating shaft 122 rotates relative to the sub-support 121 of the rotating shaft support through the second bearing 128, and the second bearing 128 may reduce the friction loss caused by the rotation of the rotating shaft 122. The sub-rotating wheel 123 and the rotating shaft 122 may have a zero-match design in the radial direction to ensure that the sub-rotating wheel 123 rotates with the rotating shaft 122. The sub-support 121 of the rotating shaft support and the rotating shaft 122 may have an avoidance design in the radial direction to ensure that a gap is defined between the sub-rotating wheel 123 and the rotating shaft 122 to achieve rotation. In the present embodiment, only two second bearings 128 are required to achieve the rotation of the rotating shaft 122 relative to the rotating shaft support, which reduces the number of bearings and simplifies the model design.

In some other implementations, the rotating shaft assembly 12 further includes two shaft covers 130. One of the shaft covers 130 abuts against an inner ring of the adjacent rotating shaft 122 from one end of the shaft hole, and the other shaft cover 130 abuts against the inner ring of the adjacent rotating shaft 122 from the other end of the shaft hole. The inner bearing ring is pressed by the shaft covers 130 to limit the rotating shaft 122 in the axial direction, thereby preventing the rotating shaft 122 from being displaced in the axial direction.

In some other embodiments, the rotating shaft assembly 12 further includes a plurality of second fasteners 129, and the second fasteners 129 pass through the sub-rotating wheels 123 and are fixedly connected with the rotating shaft 122. It may be understood that one sub-rotating wheel 123 may be fixedly connected to the rotating shaft 122 through one second fastener 129, or may also be fixedly connected to the rotating shaft 122 through the plurality of second fasteners 129, which is not limited in the present disclosure.

Referring to FIGS. 17 to 20, an embodiment of the present disclosure provides an electronic device, which may be a mobile phone, a mobile terminal, a tablet computer, a laptop, a handheld terminal device with a screen, a vehicle-mounted display device, and the like. The electronic device includes a housing, a retractable screen structure as described in the above embodiments, and a driving mechanism 99.

The housing includes a first housing 91 and a second housing 92 slidably arranged on the first housing 91 along the first direction X, the first housing 91 and the second housing 92 are enclosed to form a receiving structure 991 with an opening. The retractable screen structure is arranged in the receiving structure 991, the rotating shaft assembly 12 is located on a side close to the second housing 92, a first end 901 of the flexible display screen 90 is located on a side close to bottom of the housing, and a second end 902 of the flexible display screen 90 is connected to the first housing 91 to cover the opening. The driving mechanism 99 is arranged in the receiving structure 991. The driving mechanism 99 is connected to the sliding rail mechanism and configured to drive the sliding rail mechanism to move along the first direction X. In some other implementations, the first housing 91 may be provided with a support plate 93, the second end of the flexible display screen 90 is connected to the support plate 93, and the support plate 93 may support and protect the flexible display screen 90.

The driving mechanism 99 includes a frame body 30, a driving assembly and a transmission assembly mounted on the frame body 30. The frame body 30 may be provided with a mounting member 302 configured to be connected with the middle frame of the electronic device, and the mounting member 302 is fixed to the middle frame by a fastener, such that the driving mechanism 99 is mounted on the middle frame. In some other implementations, the number of driving mechanisms 99 may be set according to actual needs. In an example illustrated in FIG. 20, two driving mechanisms 99 are provided.

The driving assembly includes a driving member 31 and a reduction gearbox structure 32 connected to the driving member 31, and both the driving member 31 and the reduction gearbox structure 32 are mounted on the frame body 30. In some other implementations, the driving member 31 may be a driving motor or driving electric-machine.

The transmission assembly includes a first transmission member 14 and a second transmission member 15 movably connected to the first transmission member 14. The first transmission member 14 is mounted on the frame body 30 and connected to the reduction gearbox structure 32. The second transmission member 15 is configured to be in transmission connection with the flexible display screen of the retractable screen structure.

The driving member 31 outputs a first torque to the reduction gearbox structure 32, and the reduction gearbox structure 32 converts the first torque into a second torque and outputs the second torque to the first transmission member 14 to drive the first transmission member 14 to rotate, and the second transmission member 15 moves relative to the first transmission member 14 to drive the flexible display screen to move. The first torque is less than the second torque. It may be understood that the driving mechanism drives the sliding rail mechanism to move along the first direction X, so as to drive the second housing 92, the sliding rail assembly 20, the first end of the flexible display screen, and the sliding member 22 to move along the first direction X relative to the first housing 91, such that the flexible display screen 90 is switched between the expanded state and the retracted state.

Based on the above arrangement, the driving mechanism 99 converts the first torque output by the driving member into a higher second torque through the reduction gearbox structure, and then transmits the second torque to the first transmission member such that the first transmission member is then rotated, thereby driving the flexible display screen to move. In this way, a low torque of the driving member may be converted into a high torque to drive the first transmission member to rotate, so as to better drive the flexible display screen to move.

In some other implementations, the driving assembly may further include a control circuit board 312 connected to the driving member 31, which is configured to control the driving member 31 according to an instruction. The control circuit board 312 may be a FPC (Flexible Printed Circuit) board. The control circuit board 312 gets breakover with a terminal main board of the electronic device. When the flexible display screen needs to be expanded, the terminal main board transmits a command "expand" to the control circuit board 312. The control circuit board 312 controls the driving electric-machine to rotate, and the driving electric-machine amplifies the torque of the driving electric-machine through the reduction gearbox structure 32 and drives the second transmission member 15 to move linearly relative to the first transmission member 14. The second transmission member 15 drives the flexible display screen to expand outward, thus completing the expanding action of the flexible display screen. When the flexible display screen needs to retract, a user may click on the display screen of the electronic device to send a command "retract" to the terminal main board. The terminal main board transmits the command "retract" to the control circuit board 312, and the control circuit board 312 then controls the driving electric-machine to rotate (in a direction opposite to the direction of expanding rotation). The driving electric-machine amplifies the torque of the driving electric-machine through the reduction gearbox structure 32 and drives the second transmission member 15 to move linearly relative to the first transmission member 14. The second transmission member 15 drives the flexible display screen to retract to the starting position. In the present embodiment, the control circuit board 312 is connected to the driving electric-machine by welding, and the control circuit board 312 gets breakover with the terminal main board, or gets breakover with the main board terminal through a BTB connector to power on the driving electric-machine, and the driving electric-machine is controlled to rotate by a control signal.

In some other implementations, the driving electric-machine may be a DC stepper electric-machine which is an open-loop control electric-machine that converts an electric pulse signal into an angular displacement or a linear displacement. In the case of non-overload, the speed and stop position of the electric-machine only depend on frequency and pulse number of a pulse signal, and are not affected by load changes. When receiving one pulse signal, the stepper driver drives the stepper electric-machine to rotate by a fixed angle in a preset direction, and the rotation of the stepper electric-machine runs step by step at a fixed angle. The angular displacement may be controlled by controlling the pulse number, so as to achieve the purpose of accurate positioning. Moreover, the rotational speed and the rotational acceleration of the electric-machine may be controlled by controlling the pulse frequency, so as to regulate the speed and input the rotational torque.

The first transmission member 14 is a lead screw, the second transmission member 15 is a nut in threaded fit with the lead screw, and two ends of the lead screw are connected to the frame body 30 through bearings 141. The bracket 11 of the retractable screen structure is provided with a third transmission member 13. The lead screw extends along the first direction X, and the nut abuts against the third transmission member 13. The driving electric-machine drives the lead screw to rotate, and then drives the nut and the transmission member to move along the first direction X, thereby driving the sliding rail mechanism to move along the first direction X. It should be noted that the first transmission member and the second transmission member may also adopt structures such as gear racks, worm gears, and the like, which is not limited in the present disclosure.

In some other implementations, the driving mechanism 99 further includes a guide rod 33 arranged on the frame body 30, and the guide rod 33 is arranged in parallel with the lead screw. The nut includes a first sleeve portion 151 and a second sleeve portion 152, the first sleeve portion 151 is in threaded connection with the lead screw, and the second sleeve portion 152 is fitted over the guide rod 33. The second transmission member 15 is further provided with a protrusion 153 for abutting against the third transmission member 13 of the bracket 11 of the retractable screen structure. It may be understood that the nut is in threaded connection with the lead screw through the first sleeve portion 151, and when the lead screw rotates, the nut linearly moves relative to the lead screw. During the movement, the second sleeve portion 152 moves along the guide rod 33 to guide the nut.

In some other implementations, the driving member 31 includes an output shaft 311, and the reduction gearbox structure 32 includes a first reduction gearbox and a second reduction gearbox. The first reduction gearbox includes a first gear 321, the second reduction gearbox includes a second gear 322 and a third gear 323 (which may be understood as a lead screw gear) engaged with the second gear 322, the third gear 323 is connected with the first transmission member 14, the second gear 322 is engaged with the first gear 321, and the first gear 321 is connected with the output shaft 311. The output shaft 311 outputs a first torque to the first gear 321, and the first torque is converted into a second torque, by the second gear 322 and the third gear 323, to be output to the first transmission member 14. Through the gear engagement of the first gear 321, the second gear 322, and the third gear 323, a low torque output by the driving electric-machine may be converted into a high torque.

In some other implementations, the reduction gearbox structure 32 further includes a reduction gearbox end cover 34 fixedly connected to a side of the frame body 30. In some other implementations, a side of the frame body 30 is provided with a side frame 301 configured to be fixedly connected with the reduction gearbox end cover 34, and the reduction gearbox end cover 34 is fixed to the side frame 301. The gearbox end cover 34 is fixed to the side frame 301 by a plurality of fasteners 342 (e.g., screws). The first gear 321 and the second gear 322 are both connected to the reduction gearbox end cover 34, the third gear 323 is connected to the reduction gearbox end cover 34 through the first transmission member 14, and the reduction gearbox end cover 34 functions to fix the first gear 321, the second gear 322, the third gear 323 and the first transmission member 14.

In some other implementations, the first reduction gearbox includes a first bushing 324 fixed to the reduction gearbox end cover 34, and the first gear 321 is mounted to the first bushing 324. In some other implementations, the reduction gearbox end cover 34 is defined with a first through hole 341, the first bushing 324 is fixed in the first through hole 341, and the first gear 321 is a sun gear and is mounted to the first bushing 324. The second reduction gearbox includes a limit post 35 fixed to the reduction gearbox end cover 34, the second gear 322 is mounted to the limit post 35, and the limit post 35 functions to limit and fix the second gear 322.

In some other implementations, the first transmission member 14 is a lead screw, an end of the lead screw is connected to the reduction gearbox end cover 34 through the bearing 141, and the third gear 323 is engaged with the lead screw. In some other implementations, the reduction gearbox end cover 34 is further defined with a second through hole 343, the bearing 141 is mounted inside the second through hole 343, and an end of the lead screw is mounted to the bearing 141 so as to be fixed on the frame body 30.

In some other implementations, the first reduction gearbox further includes: a fixed gear ring 36, a driving gear 37, a planetary gear carrier 38 and a planetary gear 39.

The fixed gear ring 36 is connected to the driving member 31, and the output shaft 311 extends into the fixed gear ring 36.

The driving gear 37 is mounted in the fixed gear ring 36 and fixed to the output shaft 311. In some other implementations, the first reduction gearbox further includes a second bushing 371, and the driving gear 37 is mounted to the second bushing 371 to protect and limit the driving gear 37.

The planetary gear carrier 38 is mounted in the fixed gear ring 36 and is engaged with and fixed to the first gear 321. In some other implementations, the first reduction gearbox further includes a third bushing 381, and the planetary gear carrier 38 is mounted to the third bushing 381 to protect and limit the planetary gear carrier 38.

The planetary gear 39 is mounted on the planetary gear carrier 38 and is engaged with the driving gear 37.

The output shaft 311 outputs a first torque to the driving gear 37, and the first torque is reduced by the driving gear 37, the planetary gear 39, and the planetary gear carrier 38 and then transmitted to the first gear 321, achieving a first-level reduction effect. Then, the torque is reduced by the first gear 321 and then transmitted to the second gear 322, achieving a second-level reduction effect. Then, the torque is further reduced by the second gear 322 and then converted to the second torque and the second torque is transmitted to the third gear 323, achieving a third-level reduction effect. The third gear 323 transmits the second torque to the first transmission member 14 to drive the first transmission member 14 to rotate.

Based on the above arrangement, a first-level reduction gearbox is formed by the gear engagement of the driving gear 37, the planetary gear carrier 38 and the planetary gear 39. Through the gear engagement of the first gear 321, the second gear 322 and the third gear 323, second and third-level reduction gearboxes are formed. The planetary gear 39 may function as a first-level reduction gear, the first gear 321 may function as a second reduction gear, the second gear 322 may function as a third reduction gear, and the third gear 323 may function as a lead screw gear.

It may be understood that the first reduction gearbox is a core component of the driving mechanism. One end of the first reduction gearbox is mounted and welded to the driving electric-machine, and the other end of the first reduction gearbox is fixed to the frame body 30 by welding. The first reduction gearbox includes an output shaft 311 of the driving electric-machine, the driving gear 37, the second bushing 371, the planetary gear 39, the planetary gear carrier 38, the third bushing 381, the fixed gear ring 36, and the first gear 321. All parts are fixed by gear engagement, and the output shaft 311, the driving gear 37, the second bushing 371, the planetary gear 39, the planetary gear carrier 38, the third bushing 381 and the first gear 321 are all fixedly fitted inside the fixed gear ring. The driving gear 37 is fixed to the output shaft 311 of the driving electric-machine, the planetary gear carrier 38 and the first gear 321 are engaged and fixed to each other, and the other end of the first gear 321 is fixed to the first bushing 324, and is fixed to the reduction gearbox end cover 34 through the first bushing 324. The second gear 322 is fixed to the frame body 30 and the reduction gearbox end cover 34 through the limit post 35. The third gear 323 is fixed to the first transmission member 14, one end of the first transmission member 14 is fixed to the frame body 30 through a bearing 141, and the other end of the first transmission member 14 is also fixed to the reduction gearbox end cover 34 through a bearing 141. The reduction gearbox end cover 34 is fixed to the frame body 30 by a fastener 342, and the three gears (the first gear 321, the second gear 322 and the third gear 323) form second and third-level reduction gearboxes by gear engagement. The torque output by the driving electric-machine is reduced through the first reduction gearbox and the second reduction gearbox, and then a torque that is several or several tens of times greater than the output torque is output to the lead screw to drive the lead screw to rotate. The lead screw drives the nut to move. The reduction gearbox structure mainly functions to convert the low torque output by the driving electric-machine into a high torque.

In some alternative implementations, the frame body 30 may be manufactured by MIM (Powder Metallurgy), and apertures and some dimensions need to be processed by a lathe or a CNC machining center. The frame body 30 mainly functions to fix the reduction gearbox structure, the lead screws, the nuts, the bearings, the guide rod and other components. Therefore, the precision requirement and the flatness requirement for the frame body 30 are relatively high. The precision of the frame body 30 directly affects the stability of the entire driving mechanism. The entire frame body 30 may be fixed to the first housing 91 of the middle frame of the electronic device.

The nut may be made by MIM (Powder Metallurgy) and plastic two-color insert-molding, and the plastic herein is engineering plastic (POM material is commonly used), which has a self-lubricating effect. One end of the nut is fixed to the guide rod, and the other end of the nut is fixed to the lead screw. The end fixed to the lead screw needs to design a lead screw guide groove, so as to drive the nut to move linearly. According to the structural requirements of the push-out assembly, a bone position is designed on the nut to be connected and fixed to a side sliding member to push the sliding member to move. The guide rod may be made of stainless steel, which requires relatively high surface roughness, and the guide rod functions to guide and fix the nut. The lead screw is generally made of high-strength tool steel and is machined many times through a lathe or a machining center. Bearings are fixed at two ends of the lead screw, one end of the lead screw is fixed to the frame body, and the other end of the lead screw is fixed to the reduction gearbox end cover. The driving electric-machine drives the lead screw to rotate through the reduction gearbox structure, and the lead screw drives the nut to move linearly. Therefore, the strength and precision of the lead screw directly affect the stability and smoothness of the sliding member pushed by the nut.

Figure 14:
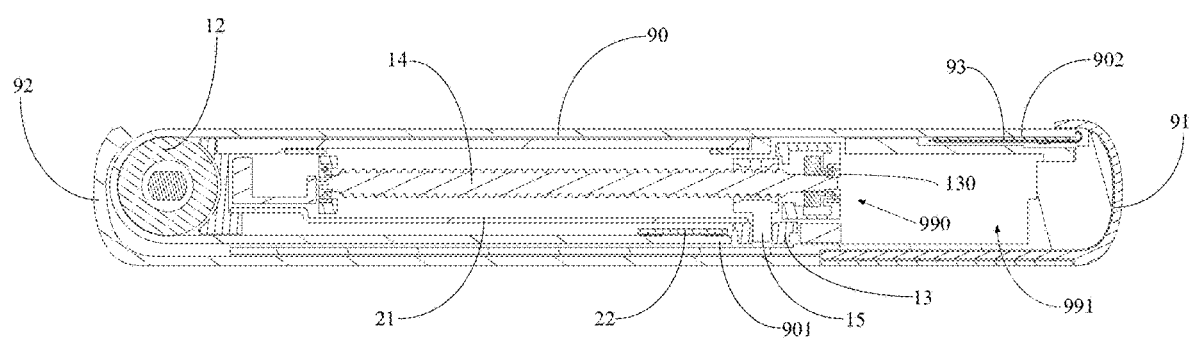
FIGS. 14 and 15 are schematic views of an electronic device according to an embodiment of the present disclosure when a flexible display screen is in a retracted state and an expanded state, respectively.

Referring again to FIGS. 14 to 16, due to the pre-tension of the elastic member of the elastic assembly, the sliding member 22 is pre-tensioned by the elastic assembly at the starting position, and due to the existence of the limit stopper 25, the sliding member 22 is kept in a static state at the starting position and the flexible display screen 90 is in a retracted state.

Figure 15:
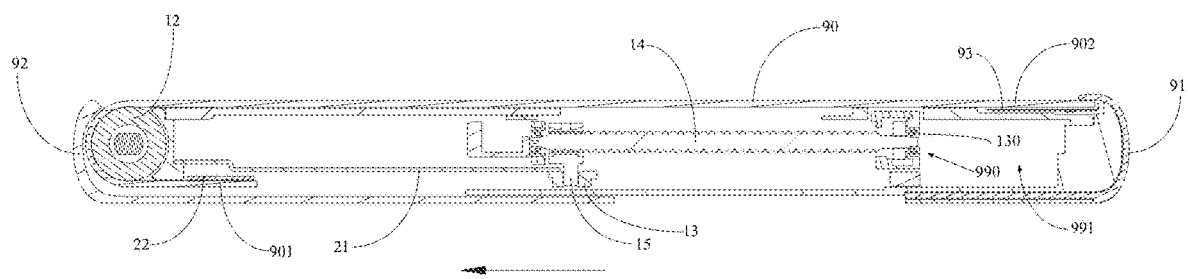
Figure 16:
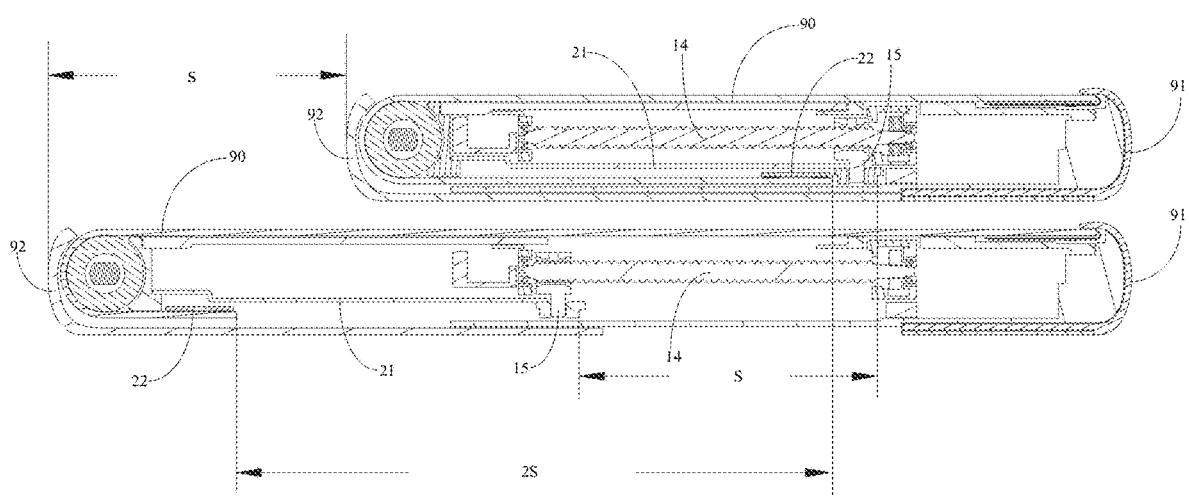
FIG. 16 shows contrast views of an electronic device according to an embodiment of the present disclosure when a flexible display screen is in a retracted state and an expanded state, respectively.
Figure 17:
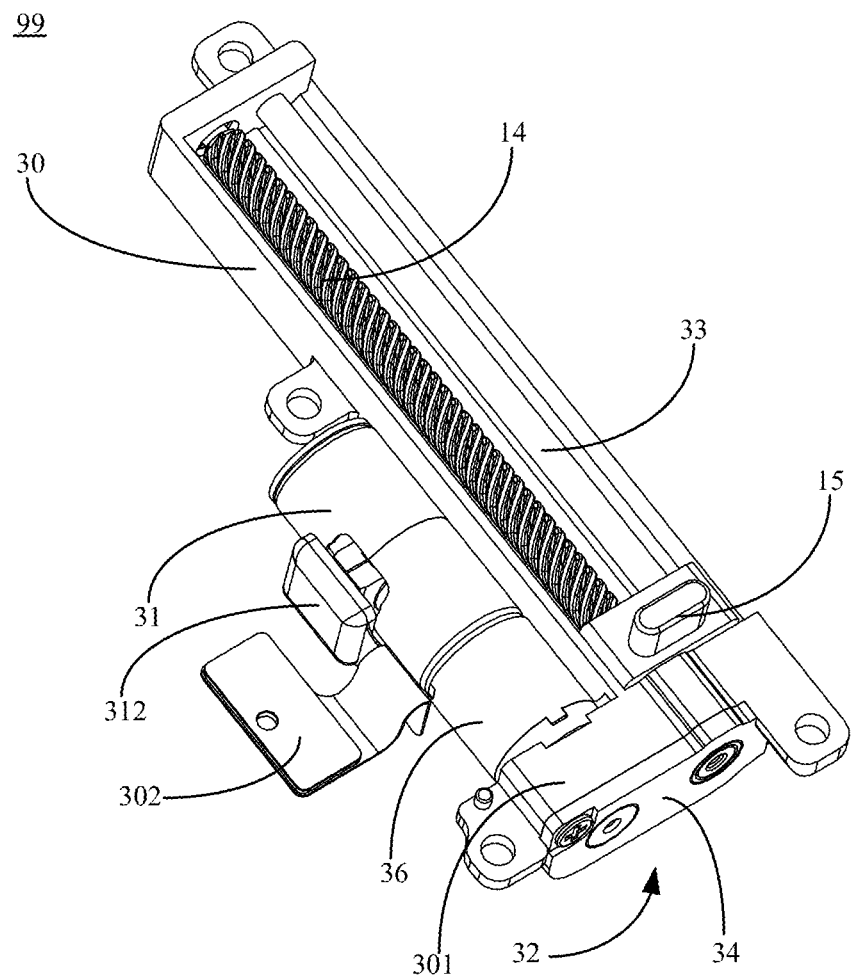
FIG. 17 is a perspective view of a driving mechanism of an electronic device according to an embodiment of the present disclosure.
Figure 18:
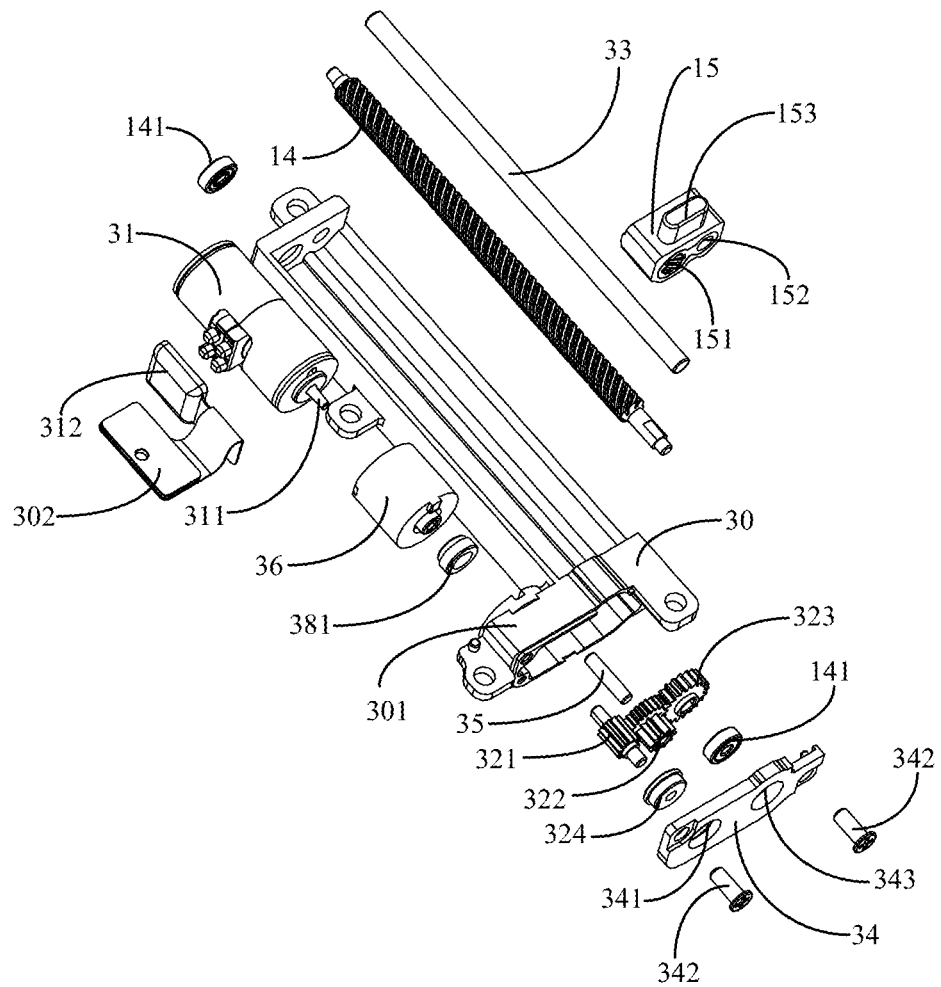
FIG. 18 is an exploded view of a driving mechanism of an electronic device according to an embodiment of the present disclosure.
Figure 19:
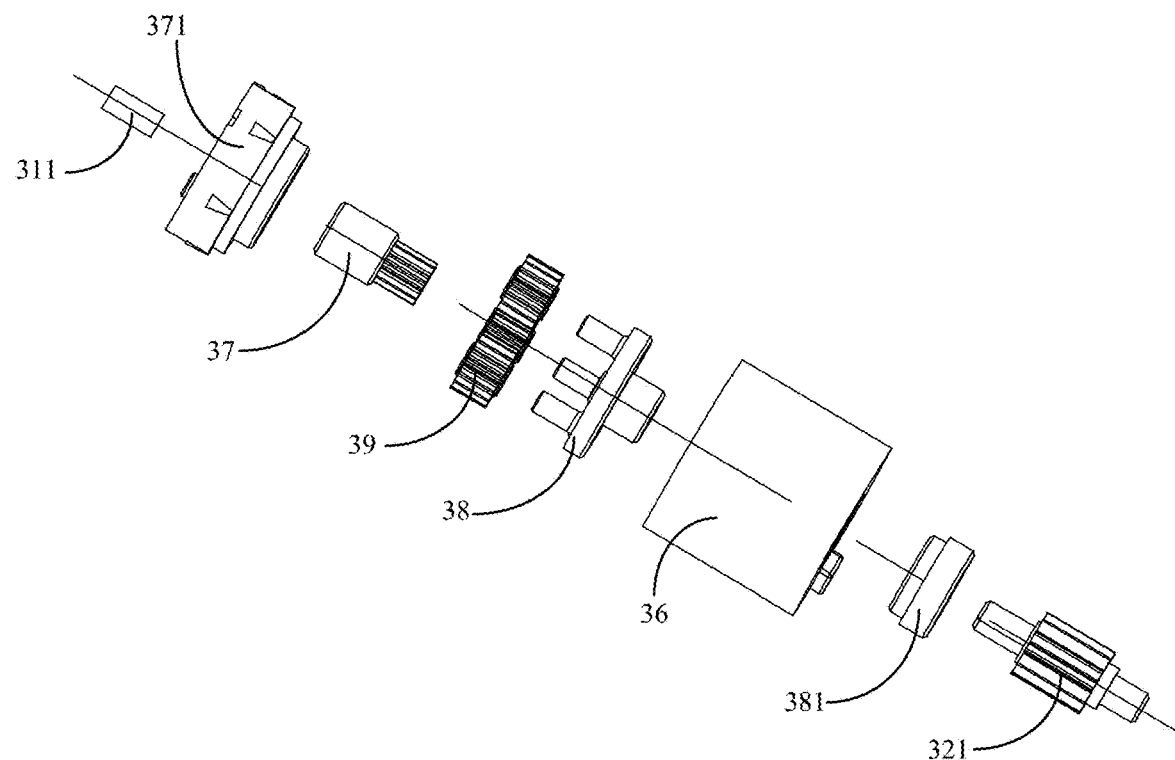
FIG. 19 is an exploded view of a first reduction gearbox of a driving mechanism of an electronic device according to an embodiment of the present disclosure.
Figure 20:
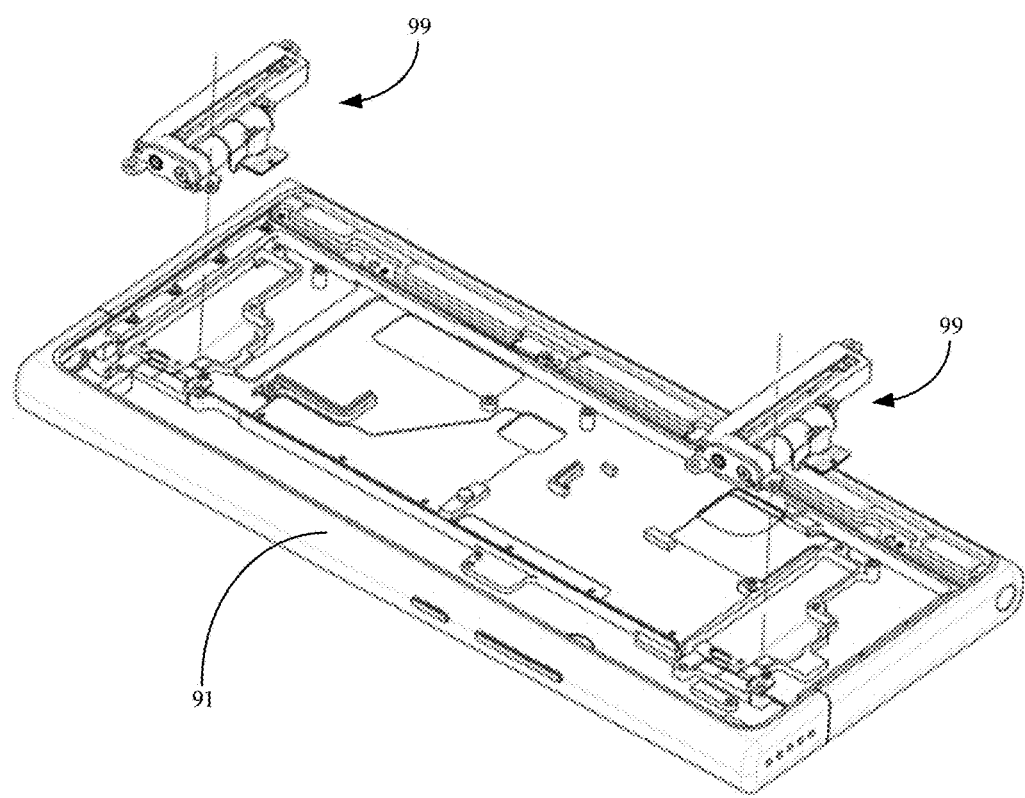
FIG. 20 is a schematic view illustrating a mounting position of a driving mechanism of an electronic device according to an embodiment of the present disclosure.

The driving mechanism is fixed to the middle frame (i.e., the housing) of the whole device as a power source. After receiving an instruction through UI, the electronic device controls the driving mechanism to drive the sliding rail mechanism to move along the first direction X (to the left as illustrated in FIG. 15) such that the whole sliding rail mechanism slides out relative to the first housing 91 in a direction away from the first housing 91. During this process, the first end of the flexible display screen 90 slides with the sliding member 22, and the rotating wheel of the rotating shaft assembly is passively rotated under the force of the flexible display screen 90. Since the second end of the flexible display screen 90 is connected with the first housing 91, as the sliding rail mechanism gradually slides out, an effect of gradually expanding the flexible display screen 90 may be achieved, as illustrated in FIG. 15. During the sliding process of the sliding rail mechanism, the sliding member 22 may be pulled by the flexible display screen to move from one end of the fixed base 21 to the other end, which may further extend the expanding length of the flexible display screen 90. In addition, during the sliding process, the elastic assembly is pulled by the sliding member 22 to generate an elastic pulling force to the sliding member 22 in a direction opposite to the sliding direction. The flexible display screen 90 is constantly subjected to the pulling force in the opposite direction, which is equivalent to pulling the flexible display screen 90 to the right, such that the stretched flexible display screen 90 becomes flatter. In this way, it may ensured that the flexible display screen 90 may move along a curving track according to the design intent, thereby preventing the visual problems such as bulging, swelling and distortion of the screen when the whole device is slid open.

It may be understood that during the whole process, the sliding member 22 is pulled by the second end of the flexible display screen 90 to move from one end of the fixing base 21 to the other end. Assuming that the sliding stroke of the sliding rail mechanism relative to the first housing 91 is denoted as S and the sliding stroke of the sliding member 22 is denoted as S, the first end of the flexible display screen 90 moves a distance of 2S with the sliding rail mechanism relative to the first housing 91.

When the whole device receives an external instruction to retract, the drive motor starts to drive in a reverse direction to retract the sliding rail mechanism and the flexible display screen. During this process, the bracket and the fixed base are driven by the driving mechanism to move in the reverse direction. The flexible display screen and the sliding member are gradually retracted under the elastic force of the elastic assembly, and the sliding member returns to the starting position under the elastic force of the elastic assembly, thereby restoring the flexible display screen to the retracted state. Therefore, the sliding rail mechanism of the present disclosure may smoothly and effectively ensure that the flexible display screen maintains the curved shape in appearance during the sliding and retracting process of the whole device, and ensure that the power loss caused by the friction generated during the sliding and retracting process of the screen is at a relatively low level. The solution is operable and easy to implement and the product reliability may be ensured.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. A driving mechanism for a retractable screen structure, comprising a frame body, a driving assembly and a transmission assembly, both the driving assembly and the transmission assembly being mounted on the frame body;

the driving assembly comprising a driving member and a reduction gearbox structure connected to the driving member, both the driving member and the reduction gearbox structure being mounted to the frame body;

the transmission assembly comprising a first transmission member and a second transmission member movably connected to the first transmission member, the first transmission member being mounted to the frame body and connected to the reduction gearbox structure, the second transmission member being configured to be in transmission connection with a flexible display screen of the retractable screen structure;

the driving member outputting a first torque to the reduction gearbox structure, the reduction gearbox structure converting the first torque into a second torque and outputting the second torque to the first transmission member to drive the first transmission member to rotate, the second transmission member moving relative to the first transmission member to drive the flexible display screen to move, wherein the first torque is less than the second torque, wherein the driving member comprises an output shaft, and the reduction gearbox structure comprises a first reduction gearbox and a second reduction gearbox;

the first reduction gearbox comprises a first gear, the second reduction gearbox comprises a second gear and a third gear engaged with the second gear, the third gear is connected with the first transmission member, the second gear is engaged with the first gear, and the first gear is connected with the output shaft;

the output shaft outputs a first torque to the first gear, and the first torque is converted into a second torque, by the second gear and the third gear, to be output to the first transmission member.

2. The driving mechanism according to claim 1, wherein the first transmission member is a lead screw, the second transmission member is a nut in threaded fit with the lead screw, and two ends of the lead screw are connected to the frame body through bearings.

3. The driving mechanism according to claim 2, further comprising a guide rod arranged on the frame body, the guide rod being arranged in parallel with the lead screw;

the nut comprising a first sleeve portion and a second sleeve portion, the first sleeve portion being in threaded connection with the lead screw, the second sleeve portion being fitted over the guide rod.

4. The driving mechanism according to claim 1, wherein the first reduction gearbox further comprises:

a fixed gear ring connected to the driving member, the output shaft extending into the fixed gear ring;

a driving gear mounted in the fixed gear ring and fixed to the output shaft;

a planetary gear carrier mounted in the fixed gear ring and engaged with and fixed to the first gear; and a planetary gear mounted on the planetary gear carrier and engaged with the driving gear;

the output shaft outputting a first torque to the driving gear, the first torque being transmitted to the second gear by the driving gear, the planetary gear, and the planetary gear carrier.

5. The driving mechanism according to claim 1, wherein the driving member is a driving motor or driving electric-machine.

6. The driving mechanism according to claim 1, wherein the driving assembly further comprises a control circuit board connected to the driving member.

7. The driving mechanism according to claim 6, wherein the control circuit board is a flexible printed circuit board.

8. The driving mechanism according to claim 1, wherein the reduction gearbox structure further comprises a reduction gearbox end cover fixedly connected to a side of the frame body;
the first gear and the second gear are both connected to the reduction gearbox end cover, and the third gear is connected to the reduction gearbox end cover through the first transmission member.

9. The driving mechanism according to claim 8, wherein the first reduction gearbox comprises a first bushing fixed to the reduction gearbox end cover, and the first gear is mounted to the first bushing.

10. The driving mechanism according to claim 8, wherein the second reduction gearbox comprises a limit post fixed to the reduction gearbox end cover, and the second gear is mounted to the limit post.

11. The driving mechanism according to claim 8, wherein the first transmission member is a lead screw, a first end of the lead screw is connected to the reduction gearbox end cover through a first bearing, and the third gear is engaged with the lead screw.

12. The driving mechanism according to claim 8, wherein the side of the frame body is provided with a side frame fixedly connected with the reduction gearbox end cover.

13. The driving mechanism according to claim 9, wherein the reduction gearbox end cover is defined with a first through hole, the first bushing is fixed in the first through hole, and the first gear is a sun gear and is mounted to the first bushing.

14. The driving mechanism according to claim 11, wherein the reduction gearbox end cover is further defined with a second through hole, a second bearing is mounted inside the second through hole, and a second end of the lead screw is mounted to the second bearing to be fixed on the frame body.

15. An electronic device, comprising:
a housing comprising a first housing and a second housing slidably arranged on the first housing along a first direction, the first housing and the second housing being enclosed to form a receiving structure with an opening;
a retractable screen structure arranged in the receiving structure, the retractable screen structure including a bracket and a flexible display screen, a first end of the flexible display screen being connected to the bracket and located on a side close to bottom of the housing, a second end of the flexible display screen being connected to the first housing to cover the opening; and
a driving mechanism comprising a frame body, as well as a driving assembly and a transmission assembly mounted on the frame body;
the driving assembly comprising a driving member and a reduction gearbox structure connected to the driving member, both the driving member and the reduction gearbox structure being mounted to the frame body;
the transmission assembly comprising a first transmission member and a second transmission member movably connected to the first transmission member, the first transmission member being mounted to the frame body and connected to the reduction gearbox structure, the second transmission member being configured to be in transmission connection with a flexible display screen of the retractable screen structure;
the driving member outputting a first torque to the reduction gearbox structure, the reduction gearbox structure converting the first torque into a second torque and outputting the second torque to the first transmission member to drive the first transmission member to rotate, the second transmission member moving relative to the first transmission member to drive the flexible display screen to move, wherein the first torque is less than the second torque;
the driving mechanism being arranged in the receiving structure, the driving mechanism being connected to the bracket and configured to drive the bracket to move along the first direction;
the driving mechanism driving the bracket to move along the first direction, so as to drive the second housing and the first end of the flexible display screen to move along the first direction relative to the first housing, such that the flexible display screen is switched between a retracted state and an expanded state.

16. The electronic device according to claim 15, further comprising a sliding rail assembly slidably arranged on the bracket along the first direction, the sliding rail assembly being connected to the first end of the flexible display screen;
when the flexible display screen moves along the first direction, the flexible display screen driving the sliding rail assembly to slide along the first direction relative to the bracket.

17. The electronic device according to claim 15, wherein the first housing is provided with a support plate, the second end of the flexible display screen is connected to the support plate.

18. The electronic device according to claim 15, wherein the bracket of the retractable screen structure is provided with a third transmission member, and the second transmission member is further provided with a protrusion for abutting against the third transmission member of the bracket of the retractable screen structure.

19. The electronic device according to claim 15, wherein the electronic device comprises two driving mechanisms.

* * * * *